United States Patent
Annen et al.

(10) Patent No.: US 8,513,872 B2
(45) Date of Patent: Aug. 20, 2013

(54) LIGHT EMITTING APPARATUS AND METHOD FOR MANUFACTURING THEREOF

(75) Inventors: Kazunori Annen, Osaka (JP); Makoto Izumi, Osaka (JP); Kimiko Mieda, Osaka (JP); Kenichi Yoshimura, Osaka (JP); Hiroshi Fukunaga, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 120 days.

(21) Appl. No.: 13/198,432

(22) Filed: Aug. 4, 2011

(65) Prior Publication Data
US 2012/0032578 A1 Feb. 9, 2012

(30) Foreign Application Priority Data

| Aug. 5, 2010 | (JP) | 2010-175873 |
| Oct. 13, 2010 | (JP) | 2010-230555 |
| Dec. 8, 2010 | (JP) | 2010-273091 |
| Mar. 3, 2011 | (JP) | 2011-045917 |
| Jun. 28, 2011 | (JP) | 2011-142412 |
| Jun. 28, 2011 | (JP) | 2011-142413 |

(51) Int. Cl.
*H01L 51/00* (2006.01)

(52) U.S. Cl.
USPC ......................... 313/501; 313/483

(58) Field of Classification Search
USPC ........................ 313/483, 498–512
See application file for complete search history.

(56) References Cited

U.S. PATENT DOCUMENTS

| 3,707,641 A | 12/1972 | Thornton |
| 4,216,408 A | 8/1980 | Verstegen et al. |
| 4,390,637 A | 6/1983 | Daiku |
| 5,611,959 A | 3/1997 | Kijima et al. |
| 5,684,359 A | 11/1997 | Yano et al. |
| 6,096,243 A | 8/2000 | Oshio et al. |
| 6,340,824 B1 | 1/2002 | Komoto et al. |
| 6,565,771 B1 | 5/2003 | Ono et al. |

(Continued)

FOREIGN PATENT DOCUMENTS

| CN | 1129727 | 8/1996 |
| CN | 1289455 | 3/2001 |

(Continued)

OTHER PUBLICATIONS

Shimomura, Y. et al. (2004). "Luminescent Properties of Green Phosphor $Ca_3Sc_2Si_3O_{12}$:Ce." Extended Abstracts (The $65^{th}$ Autumn Meeting, 2004). Proceedings of the $65^{th}$ Annual Meeting for the Japan Society of Applied Physics. 1285 with cover page.

(Continued)

*Primary Examiner* — Anne Hines
(74) *Attorney, Agent, or Firm* — Morrison & Foerster LLP

(57) ABSTRACT

A light emitting apparatus includes a light emitting device emitting primary light and a wavelength conversion unit absorbing a part of the primary light to emit secondary light. The wavelength conversion unit includes a first wavelength conversion unit containing at least a nanocrystalline phosphor and a second wavelength conversion unit containing a rare-earth-activated phosphor or a transition-metal-element-activated phosphor. In the light emitting device, the first wavelength conversion unit and the second wavelength conversion unit are closely stacked in order.

15 Claims, 7 Drawing Sheets

(56) References Cited

U.S. PATENT DOCUMENTS

| | | | |
|---|---|---|---|
| 6,576,157 B2 | 6/2003 | Ono et al. | |
| 6,632,379 B2 | 10/2003 | Mitomo et al. | |
| 6,635,363 B1 * | 10/2003 | Duclos et al. | 428/690 |
| 6,680,004 B2 | 1/2004 | Ono et al. | |
| 6,686,691 B1 | 2/2004 | Mueller et al. | |
| 6,717,353 B1 | 4/2004 | Mueller et al. | |
| 6,812,500 B2 | 11/2004 | Reeh et al. | |
| 7,026,755 B2 | 4/2006 | Setlur et al. | |
| 7,026,756 B2 | 4/2006 | Shimizu et al. | |
| 7,077,978 B2 | 7/2006 | Setlur et al. | |
| 7,176,623 B2 | 2/2007 | Nitta et al. | |
| 7,265,488 B2 | 9/2007 | Ng et al. | |
| 7,345,317 B2 | 3/2008 | Reeh et al. | |
| 7,453,195 B2 | 11/2008 | Radkov | |
| 7,737,621 B2 | 6/2010 | Masuda et al. | |
| 7,808,012 B2 | 10/2010 | Masuda et al. | |
| 2002/0063301 A1 | 5/2002 | Hanamoto et al. | |
| 2002/0079506 A1 | 6/2002 | Komoto et al. | |
| 2002/0088985 A1 | 7/2002 | Komoto et al. | |
| 2003/0030368 A1 | 2/2003 | Ellens et al. | |
| 2003/0052595 A1 * | 3/2003 | Ellens et al. | 313/501 |
| 2003/0080341 A1 | 5/2003 | Sakano et al. | |
| 2003/0218180 A1 | 11/2003 | Fujiwara | |
| 2004/0056256 A1 | 3/2004 | Bokor et al. | |
| 2004/0095063 A1 | 5/2004 | Murazaki et al. | |
| 2004/0245532 A1 | 12/2004 | Maeda et al. | |
| 2004/0251809 A1 | 12/2004 | Shimomura et al. | |
| 2005/0001225 A1 | 1/2005 | Yoshimura et al. | |
| 2005/0001533 A1 | 1/2005 | Huber et al. | |
| 2005/0062417 A1 | 3/2005 | Okuyama et al. | |
| 2005/0093442 A1 | 5/2005 | Setlur et al. | |
| 2005/0156496 A1 | 7/2005 | Takashima et al. | |
| 2005/0184638 A1 | 8/2005 | Mueller et al. | |
| 2005/0189863 A1 | 9/2005 | Nagatomi et al. | |
| 2005/0212397 A1 | 9/2005 | Murazaki et al. | |
| 2006/0038477 A1 | 2/2006 | Tamaki et al. | |
| 2006/0045832 A1 | 3/2006 | Nagatomi et al. | |
| 2006/0198418 A1 | 9/2006 | Hama et al. | |
| 2006/0208262 A1 | 9/2006 | Sakuma et al. | |
| 2006/0226759 A1 | 10/2006 | Masuda et al. | |
| 2006/0244358 A1 * | 11/2006 | Kim et al. | 313/486 |
| 2007/0007494 A1 | 1/2007 | Hirosaki et al. | |
| 2007/0029565 A1 | 2/2007 | Masuda et al. | |
| 2007/0052342 A1 | 3/2007 | Masuda et al. | |
| 2007/0054065 A1 | 3/2007 | Shutou | |
| 2007/0257596 A1 | 11/2007 | Shimomura et al. | |
| 2007/0259206 A1 | 11/2007 | Oshio | |
| 2008/0029720 A1 | 2/2008 | Li | |
| 2008/0093979 A1 | 4/2008 | Bechtel et al. | |
| 2008/0105887 A1 | 5/2008 | Narendran et al. | |
| 2008/0106186 A1 | 5/2008 | Ishii et al. | |
| 2008/0191620 A1 | 8/2008 | Moriyama et al. | |
| 2008/0231170 A1 | 9/2008 | Masato et al. | |
| 2008/0258602 A1 | 10/2008 | Masuda et al. | |
| 2009/0014741 A1 | 1/2009 | Masuda et al. | |
| 2009/0021141 A1 | 1/2009 | Emoto et al. | |
| 2009/0114938 A1 | 5/2009 | Hsu et al. | |
| 2009/0267484 A1 | 10/2009 | Kasakura et al. | |
| 2009/0272996 A1 | 11/2009 | Chakraborty | |
| 2010/0052504 A1 | 3/2010 | Sato et al. | |
| 2010/0213821 A1 | 8/2010 | Masuda et al. | |
| 2011/0019707 A1 * | 1/2011 | Sato et al. | 372/45.01 |
| 2011/0128466 A1 | 6/2011 | Ishii et al. | |

FOREIGN PATENT DOCUMENTS

| | | |
|---|---|---|
| CN | 1591744 | 3/2005 |
| EP | 0 418 902 | 3/1991 |
| EP | 1 433 831 | 6/2004 |
| EP | 1 568 753 | 3/2005 |
| EP | 1 806 390 | 7/2007 |
| JP | 49-077893 | 7/1974 |
| JP | 03-106988 | 5/1991 |
| JP | 10-228868 | 8/1998 |
| JP | 10-242513 | 9/1998 |
| JP | 11-87770 | 3/1999 |
| JP | 2000-31531 | 1/2000 |
| JP | 2000-31532 | 1/2000 |
| JP | 2000-109826 | 4/2000 |
| JP | 2001-26407 | 1/2001 |
| JP | 2001-127346 | 5/2001 |
| JP | 2001-172623 | 6/2001 |
| JP | 2002-003836 | 1/2002 |
| JP | 2002-003837 | 1/2002 |
| JP | 2002-060747 | 2/2002 |
| JP | 2002-171000 | 6/2002 |
| JP | 2002-249766 | 9/2002 |
| JP | 2002-275462 | 9/2002 |
| JP | 2002-363554 | 12/2002 |
| JP | 2003-64358 | 3/2003 |
| JP | 2003-101078 | 4/2003 |
| JP | 2003-110150 | 4/2003 |
| JP | 2003-121838 | 4/2003 |
| JP | 2003-124527 | 4/2003 |
| JP | 2003-249694 | 9/2003 |
| JP | 2003-321675 | 11/2003 |
| JP | 2003-347588 | 12/2003 |
| JP | 2004-55632 | 2/2004 |
| JP | 2004-071357 | 3/2004 |
| JP | 2004-155907 | 6/2004 |
| JP | 2004-161806 | 6/2004 |
| JP | 2004-161871 | 6/2004 |
| JP | 2004-161982 | 6/2004 |
| JP | 2004-179644 | 6/2004 |
| JP | 2004-182780 | 7/2004 |
| JP | 2004-186278 | 7/2004 |
| JP | 2004-210921 | 7/2004 |
| JP | 2004-287323 | 10/2004 |
| JP | 2004-327492 | 11/2004 |
| JP | 2005-93896 | 4/2005 |
| JP | 2005-109085 | 4/2005 |
| JP | 2005-228996 | 8/2005 |
| JP | 2005-239985 | 9/2005 |
| JP | 2005-244075 | 9/2005 |
| JP | 2005-244226 | 9/2005 |
| JP | 2005-255895 | 9/2005 |
| JP | 2005-272486 | 10/2005 |
| JP | 2005-277127 | 10/2005 |
| JP | 2005-298805 | 10/2005 |
| JP | 2006-16413 | 1/2006 |
| JP | 2006-49799 | 2/2006 |
| JP | 2006-63233 | 3/2006 |
| JP | 2006-89547 | 4/2006 |
| JP | 2006-173498 | 6/2006 |
| JP | 2006-253336 | 9/2006 |
| JP | 2006-261512 | 9/2006 |
| JP | 2006-303373 | 11/2006 |
| JP | 2006-332269 | 12/2006 |
| JP | 2007-7045 | 1/2007 |
| JP | 2007-49114 | 2/2007 |
| JP | 2007-103512 | 4/2007 |
| JP | 2007-180483 | 7/2007 |
| JP | 2007-191680 | 8/2007 |
| JP | 2008-258171 | 10/2008 |
| JP | 2008-544553 | 12/2008 |
| JP | 2009-94199 | 4/2009 |
| JP | 2009-117831 | 5/2009 |
| JP | 2009-161642 | 7/2009 |
| JP | 2009-272634 | 11/2009 |
| JP | 2009-295870 | 12/2009 |
| JP | 2009-545888 | 12/2009 |
| JP | 2010-56398 | 3/2010 |
| JP | 2010-126596 | 6/2010 |
| JP | 2010-199400 | 9/2010 |
| WO | WO-00/33389 | 6/2000 |
| WO | WO-01/24229 | 4/2001 |
| WO | WO-02/059982 | 8/2002 |
| WO | WO-2005/044947 | 5/2005 |
| WO | WO-2005/052087 | 6/2005 |
| WO | WO-2005/071039 | 8/2005 |
| WO | WO-2005/091387 | 9/2005 |
| WO | WO-2006/041168 | 4/2006 |
| WO | WO-2006/068141 | 6/2006 |
| WO | WO-2006/093135 | 9/2006 |

| WO | WO-2009/104652 | 8/2009 |
| WO | WO-2009/123726 | 10/2009 |
| WO | WO-2009/144922 | 12/2009 |

OTHER PUBLICATIONS

Masuda, M. et al., U.S. Office Action mailed Oct. 21, 2011, directed to U.S. Appl. No. 11/515,512; 42 pages.

Masuda et al., U.S. Office Action mailed Jan. 30, 2012, directed to U.S. Appl. No. 12/774,495; 10 pages.

Masuda et al., U.S. Office Action mailed Feb. 22, 2012, directed to U.S. Appl. No. 11/515,512; 35 pages.

Notice of Grounds of Rejection mailed May 8, 2012, directed to Japanese Application No. 2011-142413; 3 pages.

Hirosaki, N. et al. (2005). "Characterization and Properties of Green-Emitting B-SiAlON:Eu2+ Powder Phosphors for White Light-Emitting Diodes," Applied Physics Letters. 86:211905-1-211905-3.

Uheda, K. et al., (Feb. 15, 2006) "Luminescence Properties of a Red Phosphor, CaAlSiN3:Eu2+, for White Light Emitting Diodes", Electrochemical and Solid State Letters, 9(4) H22-H25.

Uheda, K. et al. (Sep. 1, 2004). Luminescent Properties of the Red Nitride Phosphor (CaAlSiN3:Eu2+). Proceeding of JSAP Academic Meetings, Japan Society of Applied Physics. 1,6(3):1283; 2 pages.

Uheda et al. (2006). "Host lattice materials in the system Ca3N2-AlN-Si3N4 for white light emitting diode", phys. sta. sol. (a). 203(11):2712-2717.

Xie, et al. (2004). "Eu2+-doped-Ca-α-SiAlON: A yellow phosphor for white light-emitting diodes", Applied Physics Letters. 84(26):5404-5406.

Ziegler et al. (2008). "Silica-Coated InP/ZnS Nanocrystals as Converter Material in White LEDs," *Advanced Materials* 20:1-6.

Masuda et al., U.S. Office Action mailed Feb. 5, 2009, directed to U.S. Appl. No. 11/442,000; 9 pages.

Masuda et al., U.S. Office Action mailed Aug. 5, 2009, directed to U.S. Appl. No. 11/442,000; 14 pages.

Masuda et al., U.S. Office Action mailed Oct. 2, 2009, directed to U.S. Appl. No. 11/442,000; 14 pages.

Masuda et al., U.S. Office Action mailed Jul. 22, 2011, directed to U.S. Appl. No. 12/774,495; 9 pages.

Masuda et al., U.S. Office Action mailed Oct. 16, 2008, directed to U.S. Appl. No. 11/497,663; 11 pages.

Masuda et al., U.S. Office Action mailed May 27, 2009, directed to U.S. Appl. No. 11/497,663; 12 pages.

Masuda et al., U.S. Office Action mailed Oct. 21, 2009, directed to U.S. Appl. No. 11/497,663; 13 pages.

Masuda et al., U.S. Office Action mailed Mar. 12, 2010, directed to U.S. Appl. No. 11/497,663; 12 pages.

Masuda et al., U.S. Office Action mailed Jan. 28, 2009, directed to U.S. Appl. No. 11/515,512; 32 pages.

Masuda et al., U.S. Office Action mailed Jul. 7, 2009, directed to U.S. Appl. No. 11/515,512; 19 pages.

Masuda et al., U.S. Office Action mailed Feb. 17, 2010, directed to U.S. Appl. No. 11/515,512; 21 pages.

Masuda et al., U.S. Office Action mailed Jul. 2, 2010, directed to U.S. Appl. No. 11/515,512; 22 pages.

Masuda et al., U.S. Office Action mailed Nov. 24, 2010, directed to U.S. Appl. No. 11/515,512; 23 pages.

Masuda et al., U.S. Advisory Action mailed Mar. 16, 2011, directed to U.S. Appl. No. 11/515,512; 5 pages.

Masuda et al., U.S. Office Action mailed May 6, 2011, directed to U.S. Appl. No. 11/515,512; 19 pages.

Masuda et al., U.S. Office Action mailed Nov. 15, 2010, directed to U.S. Appl. No. 11/944,052; 12 pages.

Mauda et al., U.S. Office Action mailed Apr. 28, 2011, directed to U.S. Appl. No. 11/944,052; 8 pages.

Masuda et al., U.S. Office Action mailed Aug. 9, 2011, directed to U.S. Appl. No. 11/944,052; 3 pages.

Masuda et al., U.S. Office Action mailed Mar. 17, 2010, directed to U.S. Appl. No. 12/171,946; 7 pages.

Uheda, et al. (2004). "Red Phosphors for Warm White Light-emitting diodes," Phosphor Research Society, The 305th Meeting Technical Digest; pp. 37-47. (English Translation of Relevant Portions).

\* cited by examiner

FIG.6

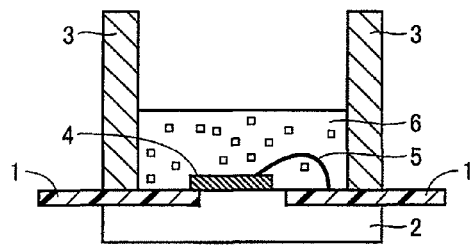

FIG.7

RELATION BETWEEN SEALING β-SiAlON CONTENT AND DEGRADATION OF NANOCRYSTALLINE PHOSPHOR

| β-SiAlON CONTENT (g) PER 1g OF SILICONE RESIN | INTEGRAL EMISSION INTENSITY OF NANOCRYSTALLINE PHOSPHOR WHEN PRODUCTION IS COMPLETED (a.u.) | INTEGRAL EMISSION INTENSITY OF NANOCRYSTALLINE PHOSPHOR AFTER 30 DAYS FROM PRODUCTION (a.u.) |
|---|---|---|
| (a) 0.03 | 100 | 43.8 |
| (b) 0.1 | 100 | 46.8 |
| (c) 0.3 | 100 | 55.5 |
| (d) 0 (ONLY SILICONE RESIN IS STACKED) | 100 | 32.3 |
| (e) 0 (WITHOUT STACKED SILICONE RESIN) | 100 | 30.5 |

FIG.10
(a) 30a
(b) 30b
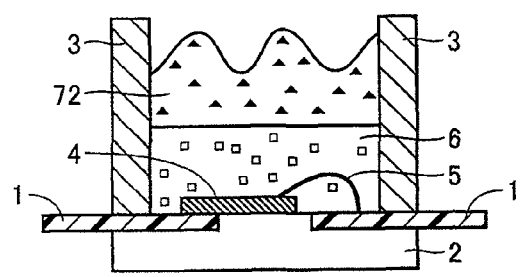
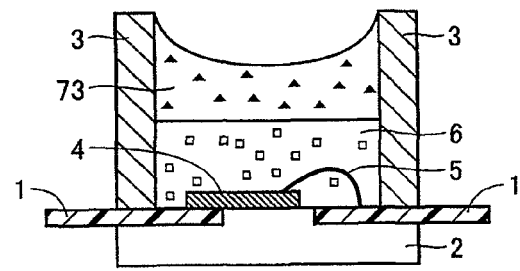
(c) 30c
(d) 30d
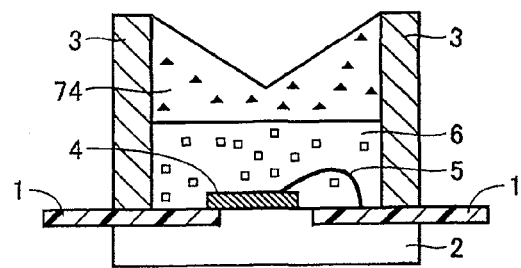
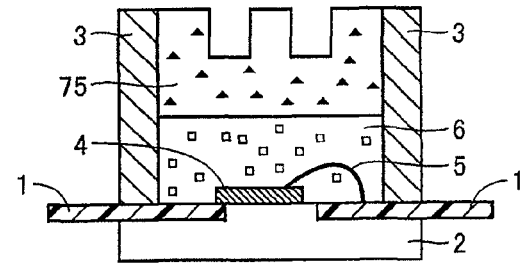
FIG.11
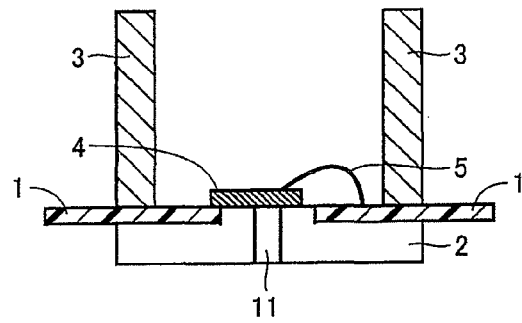

FIG.12
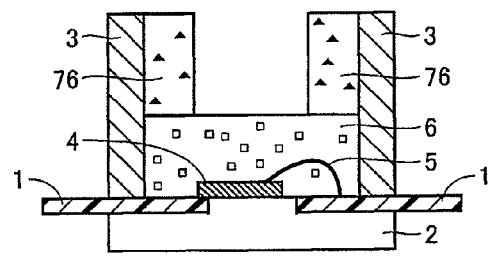
FIG.13
(a)
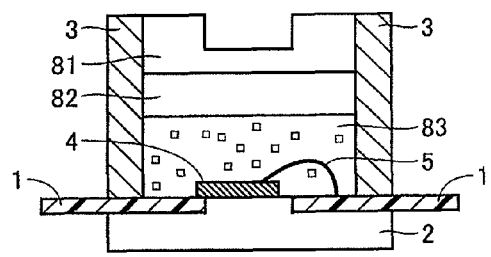
(b)
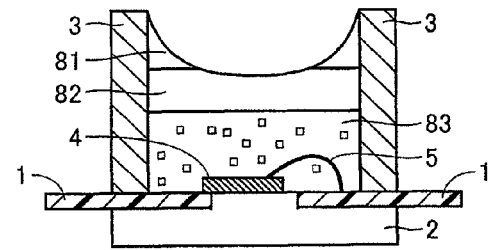
(c)
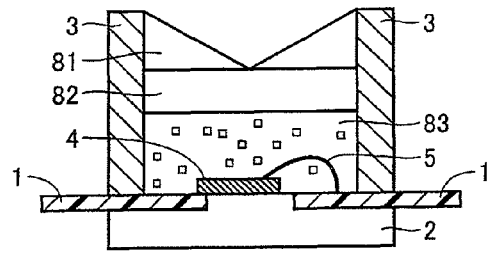
(d)
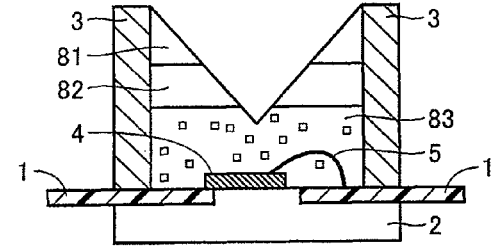

PRIOR ART

LIGHT EMITTING APPARATUS AND METHOD FOR MANUFACTURING THEREOF

This nonprovisional application is based on Japanese Patent Application No. 2010-175873 filed on Aug. 5, 2010, No. 2010-230555 filed on Oct. 13, 2010, No. 2010-273091 filed on Dec. 8, 2010, No. 2011-045917 filed on Mar. 3, 2011, No. 2011-142412 filed on Jun. 28, 2011 and No. 2011-142413 filed on Jun. 28, 2011 with the Japan Patent Office, the entire contents of which are hereby incorporated by reference.

BACKGROUND OF THE INVENTION

1. Field of the Invention

The present invention relates to a light emitting apparatus and a method for manufacturing the light emitting apparatus, and particularly to a light emitting apparatus using a phosphor excited by light emitted from a light source as well as a method for manufacturing the light emitting apparatus.

2. Description of the Background Art

As a next generation light emitting apparatus that is expected to consume less electrical power, have compact size, and exhibit high brightness, a light emitting apparatus using a light emitting diode (hereinafter LED) is being looked to. Examples of the light emitting apparatus using an LED include an LED backlight for a liquid crystal display and an LED light bulb. A light emission unit of the LED backlight or LED light bulb emits light which is different from the original light emitted from the LED itself. Specifically, the light emission unit of the light emitting apparatus using the LED emits a mixture of light into which a part of the light from the LED is wavelength-converted by a phosphor, and the original light from the LED without being wavelength-converted by the phosphor.

Use of a nanocrystal as the above-described phosphor is expected to improve the luminous efficiency as compared with conventional phosphors. A nanocrystalline phosphor can freely control the color to be emitted, from blue (short wavelength) to red (long wavelength), by changing the particle size to exhibit the quantum size effect. Conditions under which the nanocrystal is fabricated may be optimized to eliminate variations in particle size distribution of the nanocrystal and thereby obtain a nanocrystalline phosphor with a substantially uniform particle size. The uniform particle size of the nanocrystal enables a narrow emission spectrum to be obtained.

An example of the light emitting apparatus using such a nanocrystalline phosphor is disclosed in Japanese Patent Laying-Open No. 2004-071357 (Patent Document 1). FIG. 14 is a schematic side view of a light emitting apparatus of Patent Document 1. The light emitting apparatus of Patent Document 1 uses, for a wavelength conversion unit, a phosphor made up of nanocrystal particles of different sizes. Phosphor particles are distributed so that particles of greater sizes are located closer to the light source. More specifically, a red phosphor, a green phosphor, and a blue phosphor are distributed in this order so that the red phosphor is closest to the light source. Here, the red phosphor is an InN based nanocrystal of the largest particle size emitting red light. The green phosphor is an InN based nanocrystal of an intermediate particle size emitting green light. The blue phosphor is an InN based nanocrystal of the smallest particle size emitting blue light.

FIG. 15 is a schematic diagram of a light emitting apparatus in Japanese Patent Laying-Open No. 2007-049114 (Patent Document 2). Light emitting apparatus 90 of Patent Document 2 includes a light emitting device 91 emitting primary light, and a wavelength conversion unit 92 absorbing a part of the primary light and emitting secondary light having a wavelength equal to or longer than the wavelength of the primary light. Wavelength conversion unit 92 includes multiple different phosphors 93, 94, 95 having respective emission wavelengths different from each other. At least one of these multiple different phosphors has an absorption band which is capable of absorbing the secondary light emitted from at least another one of the phosphors. Such a structure enables a light emitting apparatus of a high brightness with easy setting of the emission color to be implemented.

SUMMARY OF THE INVENTION

The light emitting apparatus disclosed in above-referenced Patent Document 1 uses a single nanocrystalline material with different particles sizes for the wavelength conversion unit. The top surface of the blue phosphor in the uppermost layer of the stack of the wavelength conversion unit is exposed to the atmosphere. The nanocrystalline phosphor is potentially susceptible to oxygen and moisture, and a resultant problem is therefore that the uppermost-layer phosphor which is in direct contact with the air is degraded to cause the performance of the light emitting apparatus to be deteriorated.

Further, in light emitting apparatus 90 of above-referenced Patent Document 2, the light emitted from light emitting device 91 propagates through each layer while the light is partially absorbed or scattered in the upper layer(s), resulting in a low light extraction efficiency of the red light emitted from the lowermost layer 93. In particular, if the resin forming the upper layer(s) is of low viscosity, the phosphor is not mixed uniformly in the resin and the phosphor may then settle to form a layer. This phosphor layer hinders emission of light from light emitting device 91 or causes the light to scatter, and therefore the light from the lowermost layer 93 is hindered from being extracted. Accordingly, the balance between respective emission intensities of the colors is lost, which makes it difficult to implement ideal color reproducibility and brightness. Further, the heat radiated from the light emitting device is not sufficiently dissipated from the inside of the light emitting apparatus. Consequently, the electrical energy may not be converted into optical energy, the luminous efficiency may be reduced and the light emitting apparatus may further be deteriorated.

An object of the present invention is to implement a light emitting apparatus that utilizes the characteristics of a nanocrystalline phosphor and is still less prone to suffer from phosphor performance decline and degradation.

A light emitting apparatus according to the present invention includes a light emitting device emitting primary light, and a wavelength conversion unit absorbing a part of the primary light to emit a secondary light. The wavelength conversion unit includes a first wavelength conversion unit containing at least a nanocrystalline phosphor, and a second wavelength conversion unit containing a rare-earth-activated phosphor or a transition-metal-element-activated phosphor. In the light emitting device, the first wavelength conversion unit and the second wavelength conversion unit are closely stacked in order.

The first wavelength conversion unit and the second wavelength conversion unit may have respective light emission bands different from each other.

A wavelength of the secondary light emitted by the first wavelength conversion unit may be relatively longer than a wavelength of the secondary light emitted by the second wavelength conversion unit.

In the second wavelength conversion unit, an optically transparent material without containing a phosphor may be disposed.

The nanocrystalline phosphor may be formed of a group III-V compound semiconductor or a group II-VI compound semiconductor, and may contain one of or both InP and CdSe.

The rare-earth-activated phosphor may contain Ce or Eu as an activator, and may be a nitride-based phosphor.

Phosphors may be stacked in order of a longer peak wavelength in a direction of propagation of the primary light. The wavelength conversion unit may have a non-uniform thickness in a direction of an optical path of the primary light. The second wavelength conversion unit may have a non-uniform thickness in a direction of an optical path of the primary light.

The second wavelength conversion unit may have a smaller area than the first wavelength conversion unit, along an interface where the first wavelength conversion unit and the second wavelength conversion unit abut on each other. The light emitting apparatus may include a heat dissipation plate near the light emitting device.

A method for manufacturing a light emitting apparatus according to the present invention includes the steps of: mounting a light emitting device on a bottom of a package; forming a first wavelength conversion unit by injecting and curing a liquid resin in which a nanocrystalline phosphor is mixed to cover the light emitting device; and forming a second wavelength conversion unit by injecting and curing, on the first wavelength conversion unit, a liquid resin in which a rare-earth-activated phosphor or a transition-metal-element-activated phosphor is mixed.

The step of forming the second wavelength conversion unit may be performed by injecting and curing a liquid resin in which the rare-earth-activated phosphor or the transition-metal-element-activated phosphor and an optically transparent material without containing a phosphor are mixed. The method may further include the step of removing a part of the second wavelength conversion unit.

In accordance with an aspect of the present invention, a light emitting apparatus of a long lifetime that utilizes the characteristics of a nanocrystalline phosphor and prevents performance decline and degradation can be implemented. In accordance with another aspect, a light emitting apparatus capable of exhibiting improved color reproducibility and brightness can be implemented in a simple manner. In accordance with still another aspect, a light emitting apparatus capable of adjusting emission color, alleviating influence of light scattering, and less prone to suffer from reduced luminous efficiency or deterioration of the light emitting apparatus can be implemented in a simple manner.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5 and 6 illustrate comparative examples to be compared with examples of the present invention.

FIG. 7 illustrates the results of measurement of the integral emission intensity of the light emitting apparatus with passage of time.

FIG. 10 is a cross section of a light emitting apparatus in a fifth embodiment.

FIG. 11 illustrates an example of the light emitting apparatus in which a heat dissipation plate is disposed.

FIG. 12 is a cross section of a light emitting apparatus in a sixth embodiment.

FIG. 13 is a cross section of a light emitting apparatus in a seventh embodiment.

DESCRIPTION OF THE PREFERRED EMBODIMENTS

Figure 1:
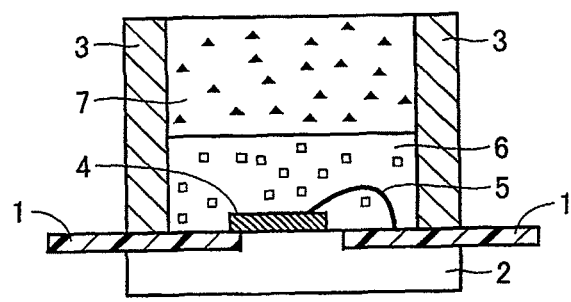
FIG. 1 is a cross section of a light emitting apparatus in a first embodiment.

Embodiments of the present invention will hereinafter be described with reference to FIGS. 1 to 13. In the drawings, the same reference characters denote the same or corresponding components. "Nanocrystal" herein refers to a crystal which has its size reduced to be substantially as small as the exciton Bohr radius so that exciton confinement and increased bandgap energy caused by the quantum size effect are observed.

First Embodiment

FIG. 1 is a cross section of a light emitting apparatus in the present embodiment. Light emitting apparatus 10 is constituted of a substrate 2 on which an electrode 1 is formed, a package 3 and a light emitting device 4 that are mounted on electrode 1, a wire 5 connecting light emitting device 4 and electrode 1, and a wavelength conversion unit. The wavelength conversion unit includes a first wavelength conversion unit 6 containing semiconductor nanoparticles and a second wavelength conversion unit 7 containing Eu-activated β-sialon phosphor that are stacked in order of propagation of light from light emitting device 4.

Electrode 1 is electrically connected by wire 5 to light emitting device 4. As the conductor that forms electrode 1, a material serving as an electrical conduction path for electrical connection with light emitting device 4 has to be used. Specifically, a metallized layer containing particles of a metal such as W, Mo, Cu, or Ag for example may be used. Substrate 2 is preferably formed of a material having a high thermal conductivity and a high total reflectivity. As the material that forms substrate 2, therefore, a ceramic material such as alumina, aluminum nitride or the like, or a polymeric resin in which metal oxide fine particles are dispersed, for example, may suitably be used.

Package 3 is formed for example of polyphthalamide having a high reflectance and good adherence to an encapsulant resin. Light emitting device 4 is used as a light source. For example, a GaN-based light emitting diode, a ZnO-based light emitting diode, a diamond-based light emitting diode or the like that has a peak wavelength at 450 nm may be used.

First wavelength conversion unit 6 is formed of a resin layer containing a phosphor. As the phosphor, an InP-based nanocrystal may be used. InP may have a reduced particle size (nanocrystallized) so that the quantum effect can be used to control the bandgap within the range from blue to red. For first wavelength conversion unit 6, an InP-based nanocrystal with its particle size adjusted so that it emits red light of an emission wavelength of 620 to 750 nm is mixed in a silicone resin that is then cured may be used.

As the red phosphor dispersed in first wavelength conversion unit 6, a group III-V compound semiconductor other than InP may be used, or a nanocrystal of a group II-VI compound semiconductor may be used. Examples of the group II-VI binary compound semiconductor may include CdS, CdSe, CdTe, ZnS, ZnSe, ZnTe, HgS, HgSe, HgTe, PbSe, PbS, and the like. Examples of the Group III-V binary compound semiconductor may include GaN, GaP, GaAs, AlN, AlP, AlAs, InN, InP, InAs, and the like.

Further, examples of ternary and quaternary compound semiconductors may include CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaNP, GaNAs, GaPAs, AlNP, AlNAs, AlPAs, InNP, InNAs, InPAs, InGaN, GaAlNP, GaAlNAs, GaAlPAs, GaInNP, GaInNAs, GaInPAs, InAlNP, InAlNAs, InAlPAs, and the like.

As the phosphor dispersed in first wavelength conversion unit 6, a nanocrystal containing In and P or a nanocrystal containing Cd and Se is preferably used, since these nanocrystals of a particle size emitting light of a wavelength in a visible range of 380 nm to 780 nm are easy to fabricate.

Preferably, as the phosphor dispersed in first wavelength conversion unit 6, InP or CdSe is used, and more preferably InP without containing Cd which exhibits high toxicity is used. InP and CdSe are each made up of a small number of elements and therefore easy to fabricate, and they exhibit a high quantum yield and a high luminous efficiency when illuminated with LED light. "Quantum yield" represents the ratio of the number of emitted photons to the number of absorbed photons.

Further, second wavelength conversion unit 7 is formed of a resin layer containing a phosphor that emits light of a wavelength different from that of above-described first wavelength conversion unit 6. As this phosphor, a rare-earth-activated phosphor or a transition-metal-element-activated phosphor is used, since these phosphors are less prone to suffer from reduced luminous efficiency which is caused by influence of oxygen or moisture. As the rare-earth-activated phosphor, YAG:Ce, namely a phosphor which is yttrium aluminum garnet (YAG) in which cerium (Ce) serving as an activator is introduced may be used for example.

Furthermore, the phosphor contained in second wavelength conversion unit 7 is preferably a nitride based phosphor activated by a rare earth or transition metal element, since it is less prone to decrease in luminous efficiency even under a high temperature condition. A possible nitride based phosphor is a sialon phosphor, suitably a phosphor which is β-sialon (SiAlON) activated by a rare earth element or a transition metal element. As the nitride based phosphor activated by a rare earth element, β-sialon activated by Tb, Yb, or Ag for example emits green light of 525 nm to 545 nm and is therefore suitable.

Further, as the phosphor which emits green light, β-sialon activated by $Eu^{2+}$ is known. The Eu-activated β-sialon can be manufactured by any conventionally known method. Specifically, the Eu-activated β-sialon phosphor is obtained for example by uniformly mixing a metal compound containing an optically active element Eu such as $Eu_2O_3$, EuN, or the like with aluminum nitride (AlN) powder and silicon nitride powder ($Si_3N_4$) and then firing the mixture at approximately 1800° C. to 2000° C. The material powder mixture ratio is appropriately selected in consideration of the composition of the phosphor after fired.

Next, an example method for manufacturing light emitting apparatus 10 will be described. The present embodiment will be described in which the resin layers containing phosphors are two layers. As long as the resin layers containing phosphors have respective emission bands different from each other, the number of layers may be larger than two. Light emitting apparatuses with the increased number of resin layers can still be manufactured similarly.

Figure 2:
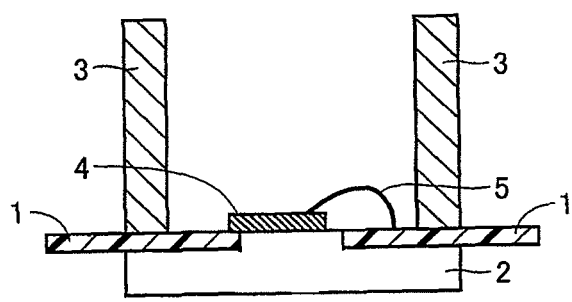
FIGS. 2 and 3 illustrate a process of manufacturing the light emitting apparatus.
Figure 3:
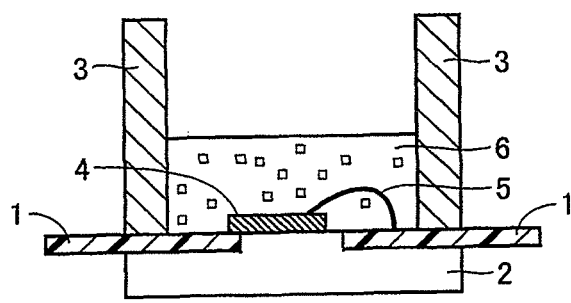

FIGS. 2 and 3 illustrate a process of manufacturing light emitting apparatus 10. First, as shown in FIG. 2, an LED package is prepared that includes electrode 1, substrate 2, package 3, light emitting device 4, and wire 5.

Next, a resin and a toluene solution containing a red phosphor which is a nanocrystal are mixed at a ratio by weight of resin:red phosphor=1000:4.62. As the red phosphor, an InP crystal material is used. As the resin, silicone resin SCR1011 manufactured by Shin-Etsu Chemical Co. Ltd. is used. Any silicone resin other than SCR1011 may be used. The silicone resin is not particularly limited as long as it is transparent, allows a nanocrystalline red phosphor to be dispersed uniformly, and resistant to heat and light. FIG. 3 illustrates a state where first wavelength conversion unit 6 has been formed. As shown in FIG. 3, a liquid resin containing a nanocrystalline red phosphor is dropped in the above-described LED package, and is cured in a predetermined time to thereby produce first wavelength conversion unit 6.

Next, a resin and an Eu-activated β-sialon phosphor are mixed at a ratio by weight of 1000:200. As the silicone resin, a resin similar to that used for first wavelength conversion unit 6 may be used.

After this, the liquid resin containing the Eu-activated β-sialon is dropped in the LED package in which first wavelength conversion unit 6 has been formed, and cured in a predetermined time to thereby produce second wavelength conversion unit 7. Here, first wavelength conversion unit 6 and second wavelength conversion unit 7 are identical in thickness in the direction of the optical path of the primary light. Depending on the specifications required of the light emitting apparatus, however, respective thicknesses may be determined as appropriate. In the above-described manner, light emitting apparatus 10 as shown in FIG. 1 is produced.

The above-described manufacturing method is not particularly limited as long as the method forms second wavelength conversion unit 7 on first wavelength conversion unit 6. Further, while second wavelength conversion unit 7 is laid on first wavelength conversion unit 6 in the present embodiment, any layer other than the above-described ones may be stacked between first wavelength conversion unit 6 and second wavelength conversion unit 7.

Figure 4:
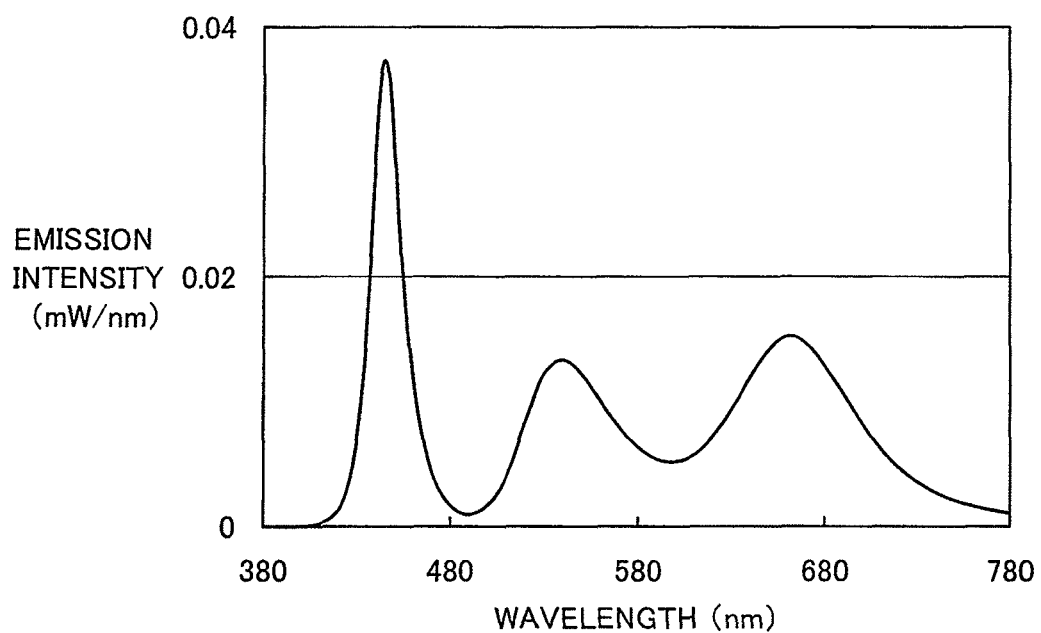
FIG. 4 illustrates an emission spectrum of the light emitting apparatus.

The emission spectrum of light emitting apparatus 10 fabricated through the above-described procedure was measured with a spectrophotometer (product name: MCPD-7000 (manufactured by Otsuka Electronics Co. Ltd.)). FIG. 4 is a graph showing the emission spectrum of light emitting apparatus 10. Since the nanocrystalline red phosphor is used, the emission spectrum is narrower than that of conventional red phosphors, the NTSC (National Television System Committee) ratio is enhanced, and the color reproducibility is improved.

In connection with the present embodiment, the method for manufacturing light emitting apparatus 10 has been illustrated in which the wavelength conversion unit includes only the first wavelength conversion unit and the second wavelength conversion unit. Another wavelength conversion unit containing another phosphor, however, may also be stacked. As the phosphor in each wavelength conversion unit, a phosphor that absorbs the whole light having an energy larger than the excitation energy of the phosphor and then emits secondary light has to be used. The secondary light emitted from a phosphor having a large excitation energy (blue phosphor for example) is more prone to be absorbed by a phosphor having a smaller excitation energy (red phosphor for example). In this case, it is difficult to achieve a desired color balance. In order to avoid such absorption of light by the phosphor, preferably a phosphor having a relatively longer peak wavelength is stacked first in the direction of propagation of the primary light. Accordingly, the secondary light emitted from each phosphor will hardly be absorbed again by another phosphor that emits another light, and a desired color balance can be achieved.

Second Embodiment

Then, by a similar method to the first embodiment, three different light emitting apparatuses are fabricated in which respective contents of the Eu-activated β-sialon contained in the second wavelength conversion unit are different. More specifically, three different light emitting apparatuses are produced in which respective amounts of Eu-activated β-sialon phosphor per 1 g of the silicone resin (SCR1011) in second wavelength conversion unit 7 are (a) 0.03 g, (b) 0.1 g, and (c) 0.3 g. As the silicone resin, SCR1011, which is the same as the first embodiment, is used and stacked to a thickness which is substantially identical to that of the second wavelength conversion unit shown in FIG. 1.

Comparative Example

Figure 5:
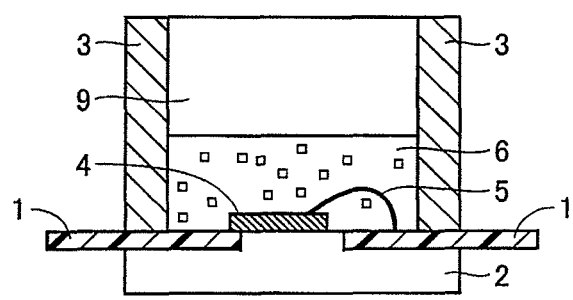

As Comparative Example 1, a light emitting apparatus (d) in which only a silicone resin 9 is stacked on first wavelength conversion unit 6 is produced (FIG. 5). As Comparative Example 2, a light emitting apparatus (e) in which no silicon resin or no layer is stacked on the first wavelength conversion unit and first wavelength conversion unit 6 is exposed to the air is produced (FIG. 6).

Results of Measurement

The results of measurement comparison between the integral emission intensity taken immediately after the light emitting apparatuses (a) to (e) as described above are produced and the integral emission intensity after a certain time therefrom are shown in FIG. 7. The integral emission intensity is calculated by measuring the emission spectrum with the spectrophotometer MCPD-7000 and integrating the emission intensity of wavelengths 630 nm to 780 nm. Specifically, the integral emission intensity of the red phosphor taken at the time each light emitting apparatus is produced is defined as 100, and the integral emission intensity of the red phosphor after 30 days from the production is calculated.

As shown by (a) to (c) in FIG. 7, the second wavelength conversion unit in which an Eu-activated β-sialon is mixed in a silicone resin can be formed so that reduction in the integral emission intensity of the nanocrystalline phosphor after 30 days from production is only almost a half of the reference value of the integral emission intensity immediately after production. In contrast, the light emitting apparatus of (e) has the integral emission intensity 30.5 a.u. (arb unit), which is considerably degraded with the passage of time. Further, the light emitting apparatus of (d) has the integral emission intensity 32.3 a.u. with its degree of deterioration smaller than that having no silicone resin. It is seen from the above that silicone resin contained in the second wavelength conversion unit protects the red phosphor contained in the first wavelength conversion unit from oxygen and moisture in the air.

As to variations with time, light emitting apparatuses (a) to (c) in which the second wavelength conversion unit containing silicone resin and the Eu-activated β-sialon phosphor is stacked have a higher integral emission intensity than that of the apparatus (d) in which only silicone resin 9 is stacked on the nanocrystalline red phosphor, or the apparatus (e) in which nothing is stacked on the first wavelength conversion unit. In particular, the integral emission intensity of the apparatus (c) in which 0.3 g of Eu-activated β-sialon phosphor is mixed in 1 g of silicone resin is 55.5 a.u., which exhibits an excellent effect of preventing degradation. Since a rare-earth-activated or transition-metal-element-activated phosphor is resistant to oxygen and moisture, this phosphor contained in the second wavelength conversion unit improves the capability of sealing and protecting the phosphor contained in the first wavelength conversion unit.

Further, increase of the concentration of the rare-earth-activated phosphor or the transition-metal-element-activated phosphor contained in the second wavelength conversion unit enhances the effect of protecting the phosphor contained in the first wavelength conversion unit, which has been demonstrated through experiments.

As heretofore described, the second wavelength conversion unit containing a rare-earth-activated phosphor or a transition-metal-element-activated phosphor that is formed on the first wavelength conversion unit containing a nanocrystalline phosphor acts to allow the rare-earth-activated or transition-metal-element-activated phosphor to perform the function of protecting the phosphor contained in the first wavelength conversion unit in addition to the functions of conventional phosphors. Thus, it is not necessary to use a special layer or cap such as resin stacked to protect the nanocrystalline phosphor from oxygen and moisture, and no additional manufacturing step is thus required. As seen from the above, the present invention can efficiently obtain a light emitting apparatus that utilizes the characteristics of the nanocrystalline phosphor while protecting the phosphor contained in the first wavelength conversion unit from oxygen and moisture and preventing deterioration of the light emitting apparatus, and therefore has excellent durability.

Third Embodiment

Figure 8:
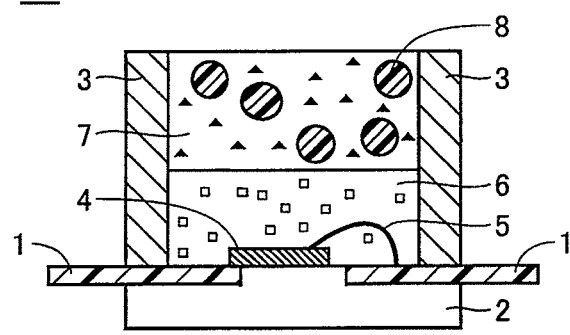
FIG. 8 is a cross section of a light emitting apparatus in a third embodiment.

The present embodiment is identical to the light emitting apparatus of the first embodiment except that resin flakes 8 are contained in second wavelength conversion unit 7 of the first embodiment. FIG. 8 is a cross section of a light emitting apparatus in the third embodiment. Resin flakes 8 dispersively mixed in second wavelength conversion unit 7 are not particularly limited as long as they are an optically transparent material, and mainly a silicone or epoxy based material is used. While resin flakes 8 in the shape of beads are commonly used, the shape is not particularly limited to this. Respective sizes of resin flakes 8, however, are preferably uniform. In the present embodiment, flakes of a resin having a refractive index identical to or close to that of the resin layer forming second wavelength conversion unit 7 are used. Here, the refractive index of the resin flakes may be different from the refractive index of the resin layer so that light scattering is utilized. Further, while the present embodiment uses resin flakes, the material is not limited to the resin as long as it is optically transparent such as glass, oxide, fluoride or the like for example.

In a similar manner to the first embodiment, first wavelength conversion unit 6 is formed as shown in FIG. 3. After this, in the LED package in which first wavelength conversion unit 6 has been formed, a liquid resin containing an Eu-activated β-sialon phosphor and resin flakes 8 is dropped and cured in a predetermined time to produce second wavelength conversion unit 7. As the liquid resin dropped as described above, a resin and an Eu-activated β-sialon phosphor and resin flakes that are mixed at a ratio by weight of 70:15:15 is used. The liquid resin used here may be a silicone resin similar to the first embodiment.

The light from first wavelength conversion unit 6 could be reflected from the resin layer interface between first wavelength conversion unit 6 and second wavelength conversion unit 7, resulting in emission loss. Further, immediately after the liquid resin is dropped in the LED package in the process of producing second wavelength conversion unit 7, the phosphor in the liquid resin could be caused to settle by gravity before the liquid resin is cured, even if the phosphor is almost uniformly dispersed in the liquid resin, resulting in a phosphor layer in the bottom portion of second wavelength conversion unit 7. This phosphor layer causes the light from first wavelength conversion unit 6 to scatter to thereby hinder the light from first wavelength conversion unit 6 from being emitted upward. Thus, depending on the state of mixture in the resin, the phosphor of second wavelength conversion unit 7 may be located locally at a certain area in second wavelength conversion unit 7 or settle to thereby deteriorate the extraction efficiency of light from light emitting device 4 and first wavelength conversion unit 6, possibly resulting in failure to achieve an ideal illumination capability.

It is difficult, however, to adjust the viscosity of the resin so that the phosphor is uniformly dispersed in the resin and the phosphor does not settle. In view of this, the present embodiment mixes resin flakes 8 together with the phosphor in the silicone resin so as to be able to prevent settlement of the phosphor before the liquid resin cures and thereby produce second wavelength conversion unit 7 in which the phosphor is uniformly dispersed. Such a simple method that adjusts the amount of resin flakes 8 can be used to manufacture an optimum light emitting apparatus 20, according to the conditions such as the amount of phosphor forming second wavelength conversion unit 7, the viscosity of the resin, and the like.

Further, resin flakes 8 without phosphor contained therein are optically transparent to the primary light from light emitting device 4 and the secondary light emitted from the phosphor. Therefore, from before the liquid resin cures, a path through which the light is transmitted can be secured in advance by resin flakes 8. In this way, light emitting apparatus 20 in FIG. 8 is manufactured.

Next, the movement of light through light emitting apparatus 20 in the present embodiment will be described. The light emitted from light emitting device 4 passes through first wavelength conversion unit 6 and enters second wavelength conversion unit 7. Here, in the case where a part of the light from light emitting device 4 passes through only the portion from the resin layer of first wavelength conversion unit 6 to the resin layer of second wavelength conversion unit 7, blue light from light emitting device 4 is extracted substantially as it is.

Another part of the light from light emitting device 4 passes through the resin layer of first wavelength conversion unit 6, the red phosphor which is a nanocrystal, the resin layer of first wavelength conversion unit 6, and resin layer of second wavelength conversion unit 7 in this order, and is extracted as red light. Still another part of the light from light emitting device 4 passes through the resin layer of first wavelength conversion unit 6, the resin layer of second wavelength conversion unit 7, the Eu-activated β-sialon phosphor, and the resin layer of second wavelength conversion unit 7 in this order, and is extracted as green layer. Still another part of the light from light emitting device 4 passes through the resin layer of first wavelength conversion unit 6, the red phosphor which is a nanocrystal, the resin layer of first wavelength conversion unit 6, the resin layer of second wavelength conversion unit 7, the Eu-activated β-sialon phosphor, and the resin layer of second wavelength conversion unit 7 in this order, and is extracted as red light.

As seen from the above, because resin flakes 8 are mixed in second wavelength conversion unit 7, the phosphor of second wavelength conversion unit 7 is dispersed without settling, and the optical path under resin flake 8 can be secured. Thus, the probability that the light from first wavelength conversion unit 6 scatters is lowered, and the light can efficiently be extracted.

As heretofore described, resin flakes 8 can be added as done in the present embodiment to disperse the phosphor in the well-balanced manner and efficiently extract the light from the first wavelength conversion unit. The shape, size, and content of mixed resin flakes 8 are not limited to those exemplarily shown in the present embodiment, and may be determined as appropriate according to specifications such as color tone of the light required of the light emitting apparatus.

Thus, the simple method that mixes resin flakes in the wavelength conversion unit can be used to implement a light emitting apparatus for which the emission color can be adjusted and set, the influence of light scattering is alleviated, and which is therefore bright and excellent in color reproducibility.

Fourth Embodiment

Figure 9:
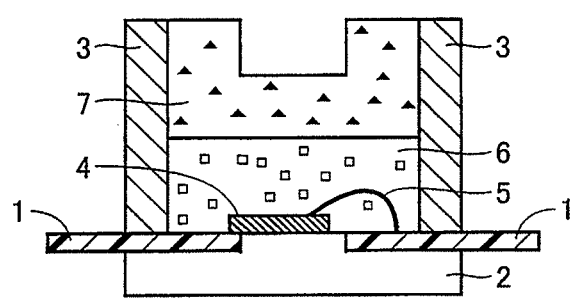
FIG. 9 is a cross section of a light emitting apparatus in a fourth embodiment.
Figure 14:
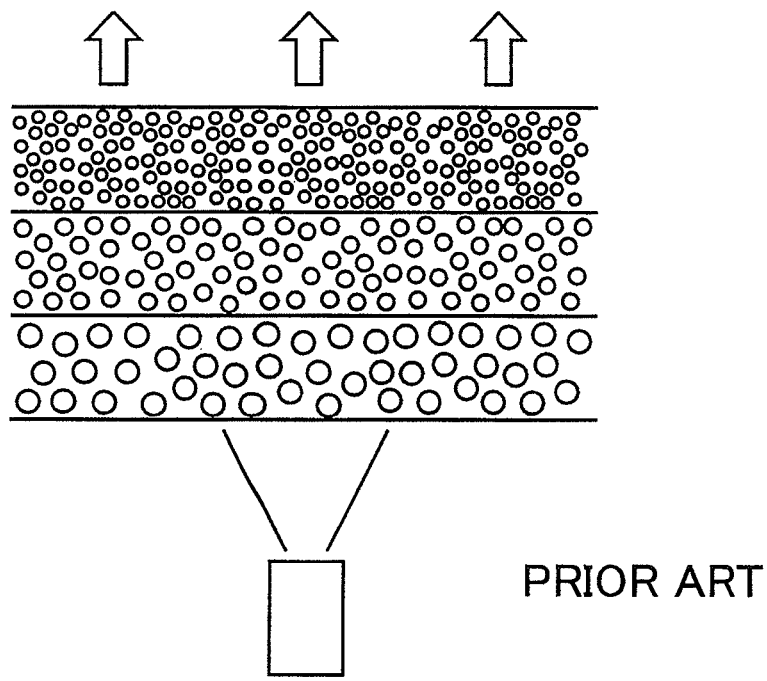
FIG. 14 is a cross section of a light emitting apparatus of Patent Document 1.
Figure 15:
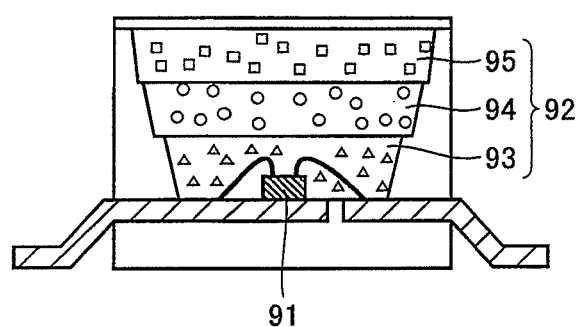
FIG. 15 is a cross section of a light emitting apparatus of Patent Document 2.

Next, a method of manufacturing a light emitting apparatus 30 will be described. A second wavelength conversion unit has a central recess for example as shown in FIG. 9, and the second wavelength conversion unit has a nonuniform thickness in the direction of the optical path of light emitting device 4. After first wavelength conversion unit 6 is produced in a similar manner to the first embodiment, an ion beam is used to partially cut away second wavelength conversion unit 7 to produce light emitting apparatus 30 shown in FIG. 9.

Fifth Embodiment

In FIG. 10, (a) to (d) show respective cross sections of light emitting apparatuses 30*a* to 30*d* in a fifth embodiment. In light emitting apparatus 30*a* shown in FIG. 10 (*a*), the surface of a second wavelength conversion unit 72 has a plurality of wavelike recesses. In light emitting apparatus 30*b* shown in FIG. 10 (*b*), a central portion of a second wavelength conversion unit 73 has a recess with a substantially U-shaped cross section. In light emitting apparatus 30*c* shown in FIG. 10 (*c*), a central portion of a second wavelength conversion unit 74 has a recess with a substantially V-shaped cross section. In light emitting apparatus 30*d* shown in FIG. 10 (*d*), the surface of a second wavelength conversion unit 75 has a cross section in the shape of angled recess and protrusion. The light emitting apparatuses shown in FIG. 10 (*a*) to (*d*) are each manufactured by a similar method to the manufacturing method of the light emitting apparatus in FIG. 9.

In the light emitting apparatuses of the fourth and fifth embodiments, the second wavelength conversion unit includes a relatively thicker portion and a relatively thinner portion in the direction of the optical path of the primary light. The relatively thinner portion of the second wavelength conversion unit, as compared with the relatively thicker portion thereof, facilitates transmission of light emitted from light emitting device 4 and first wavelength conversion unit 6. The second wavelength conversion unit which is thus partially varied in thickness enables efficient extraction of light from the first wavelength conversion unit.

A reason why the light extraction efficiency can be enhanced in the above-described manner is as follows. A thinner portion of the resin layer which forms the second wavelength conversion unit has smaller absolute amounts of the resin and the phosphor constituting the resin layer, than a thicker portion of the resin layer, and accordingly absorbs a smaller amount of light emitted from light emitting device 4 and first wavelength conversion unit 6. Another reason is that the total number of phosphor particles contained in the thinner portion of the resin layer is smaller than that of the thicker portion of the resin layer, and accordingly, in the thinner portion, the light emitted from light emitting device 4 and first wavelength conversion unit 6 is less likely to be scattered by the phosphor particles contained in the second wavelength conversion unit.

Further, the surface of second wavelength conversion unit 72-75 is partially cut away to leave a thinner portion, and consequently the surface area contacting the air is increased. Therefore, heat radiated from light emitting device 4 is dissipated upward more easily from the inside of light emitting apparatus 30. Thus, reduction of the luminous efficiency due to heat can be suppressed and thermal deterioration of light emitting apparatus 30 can be prevented. This is more effective for the case like the present embodiment in which a nanocrystalline phosphor susceptible to heat is used for first wavelength conversion unit 6, since the heat dissipation effect can suppress degradation of the nanocrystalline phosphor.

Further, as shown in FIG. 11, a heat dissipation plate 11 may be disposed under light emitting device 4. As a material for heat dissipation plate 11, aluminum, copper or the like may be used. Heat dissipation plate 11 can be disposed to allow the heat to be dissipated as well from the bottom of light emitting apparatus 30. Since heat is thus dissipated from the top and the bottom of light emitting apparatus 30, a temperature increase can further be suppressed. In connection with the present embodiment, four examples of the shape of the second wavelength conversion unit have been described. The shape, however, is not limited to them, and the shape and the thickness may appropriately be adjusted according to the color tone of light and the light quantity required of light emitting apparatus 30.

Sixth Embodiment

Next, referring to FIG. 12, a light emitting apparatus of a sixth embodiment will be described. The present embodiment differs from the fourth and fifth embodiments in that the area of a second wavelength conversion unit 76 is smaller than the area of first wavelength conversion unit 6 along the interface where first wavelength conversion unit 6 and second wavelength conversion unit 76 abut on each other.

FIG. 12 is a cross section of light emitting apparatus 30e in the present embodiment. The apparatus is fabricated so that the ratio between the area of second wavelength conversion unit 76 and the area of first wavelength conversion unit 6 along the interface where first wavelength conversion unit 6 and second wavelength conversion unit 76 abut on each other is 1:2. While the apparatus is fabricated here so that the ratio between the area of second wavelength conversion unit 76 and the area of first wavelength conversion unit 6 is 1:2, the ratio may be adjusted as appropriate according to the color tone of light and the light quantity required of light emitting apparatus 30e.

The light emitting apparatus of the present embodiment is manufactured as follows. The manufacturing method explained above in connection with the first embodiment is used to fabricate light emitting apparatus 10. After this, an ion beam is used to partially cut away second wavelength conversion unit 76 so that the ratio between the area of second wavelength conversion unit 76 and the area of first wavelength conversion unit 6 is 1:2, and thereby expose first wavelength conversion unit 6.

In the present embodiment, a part of the light from first wavelength conversion unit 6 is emitted through second wavelength conversion unit 76 and a part of the light therefrom is directly emitted without passing through second wavelength conversion unit 76. Thus, the light from first wavelength conversion unit 6 can efficiently be extracted.

This configuration allows a part of the light emitted from first wavelength conversion unit 6 to be extracted directly without passing through second wavelength conversion unit 76. Therefore, a desired quantity of red light emission can be obtained from first wavelength conversion unit 6, without partial absorption of the light by second wavelength conversion unit 76 and influence of light scattering. Further, in the region without second wavelength conversion unit 76 above first wavelength conversion unit 6, heat radiated from light emitting device 4 is more easily dissipated upward from the inside of light emitting apparatus 30e. Therefore, reduction of the luminous efficiency due to heat can be suppressed, and thermal deterioration of light emitting apparatus 30e can be prevented. This is more effective for the case like the present embodiment in which a nanocrystalline phosphor susceptible to heat is used for first wavelength conversion unit 6, since the heat dissipation effect can suppress degradation of the nanocrystalline phosphor.

Seventh Embodiment

Referring next to FIG. 13, a seventh embodiment will be described. In the present embodiment, the wavelength conversion unit is made up of three resin layers. These resin layers each contain a phosphor and respective emission bands of the resin layers are different from each other. It is preferable to stack the resin layers in such an order that a layer emitting the secondary light of a relatively longer wavelength is located relatively closer to the light emitting device, since a desired color balance can more easily be obtained. A reason for this is that the secondary light emitted from a shorter wavelength (larger excitation energy) phosphor like a blue phosphor for example is absorbed by a longer wavelength (smaller excitation energy) phosphor like a red phosphor for example, which makes it difficult to obtain a desired color balance. The same is applied as well to the above-described first to sixth embodiments.

In FIGS. 13, (*a*) to (*d*) show cross sections of light emitting apparatuses 30f to 30i in the present embodiment. A resin layer 81 of light emitting apparatus 30f in FIG. 13 (*a*) has a central portion where a recess with a substantially rectangular cross section is provided. Light emitting apparatus 30g shown in FIG. 13 (*b*) has a central portion where a recess with a substantially U-shaped cross section is provided to extend in resin layer 81 and resin layer 82. In light emitting apparatus 30h of FIG. 13 (*c*), resin layer 81 has a central portion where a recess with a substantially V-shaped cross section is provided. In light emitting apparatus 30i shown in FIG. 13 (*d*), a recess with a substantially V-shaped cross section is provided to extend in resin layer 81, resin layer 82, and resin layer 83.

The wavelength conversion unit thus has the varied thickness, which can facilitate extraction of light from the phosphor contained in the resin layer located relatively closer to light emitting device 4. Further, a thinner portion of the resin layer allows heat radiated from light emitting device 4 to be easily dissipated upward from the inside of light emitting apparatus 30. In this way, reduction of the luminous efficiency due to heat can be suppressed, and thermal deterioration of light emitting apparatus 30 can be prevented. This is more effective for the case like the present embodiment in which a nanocrystalline phosphor susceptible to heat is used for first wavelength conversion unit 6, since the heat dissipation effect can suppress degradation of the nanocrystalline phosphor. The number of resin layers and the shape, size, depth of the recess are not limited to the examples illustrated in the present embodiment, and may be determined as appropriate according to the specifications required of the light emitting apparatus.

The thickness of the wavelength conversion unit can thus be varied to enable adjustment and setting of emission color, alleviate the influence of light scattering, and accordingly a bright light emitting apparatus with good color reproducibility can be implemented.

Although the present invention has been described and illustrated in detail, it is clearly understood that the same is by way of illustration and example only and is not to be taken by way of limitation, the scope of the present invention being interpreted by the terms of the appended claims.

The present invention can implement a light emitting apparatus capable of utilizing the characteristics of a nanocrystalline phosphor and still preventing performance decline and degradation.

What is claimed is:

1. A light emitting apparatus comprising:
    a light emitting device emitting primary light; and
    a wavelength conversion unit absorbing a part of said primary light to emit a secondary light,
    said wavelength conversion unit including
        a first wavelength conversion unit containing at least a nanocrystalline phosphor, and
        a second wavelength conversion unit containing a resin in which a rare-earth-activated phosphor or a transition-metal-element-activated phosphor is mixed, and
    in said light emitting device, said first wavelength conversion unit and said second wavelength conversion unit being closely stacked in order,
    wherein an optically transparent material without containing a phosphor is mixed in the resin for the second wavelength conversion unit and has a reflective index identical to or close to a reflective index of the resin for the second wavelength conversion unit so as to secure an optical path of light emitted from the light emitting device.

2. The light emitting apparatus according to claim 1, wherein
    said first wavelength conversion unit and said second wavelength conversion unit have respective light emission bands different from each other.

3. The light emitting apparatus according to claim 1, wherein
    a wavelength of the secondary light emitted by said first wavelength conversion unit is relatively longer than a wavelength of the secondary light emitted by said second wavelength conversion unit.

4. The light emitting apparatus according to claim 1, wherein
    said nanocrystalline phosphor is formed of a group III-V compound semiconductor or a group II-VI compound semiconductor.

5. The light emitting apparatus according to claim 1, wherein said nanocrystalline phosphor contains one of or both InP and CdSe.

6. The light emitting apparatus according to claim 1, wherein said rare-earth-activated phosphor contains Ce or Eu as an activator.

7. The light emitting apparatus according to claim 1, wherein said rare-earth-activated phosphor is a nitride-based phosphor.

8. The light emitting apparatus according to claim 1, wherein
    said phosphors are stacked in order of a longer peak wavelength in a direction of propagation of said primary light.

9. The light emitting apparatus according to claim 1, wherein
    said wavelength conversion unit has a non-uniform thickness in a direction of an optical path of said primary light.

10. The light emitting apparatus according to claim 1, wherein
    said second wavelength conversion unit has a non-uniform thickness in a direction of an optical path of said primary light.

11. The light emitting apparatus according to claim 1, wherein
    said second wavelength conversion unit has a smaller area than said first wavelength conversion unit, along an interface where said first wavelength conversion unit and said second wavelength conversion unit abut on each other.

12. The light emitting apparatus according to claim 1, wherein
    said light emitting apparatus comprises a heat dissipation plate near said light emitting device.

13. A method for manufacturing a light emitting apparatus, comprising the steps of:
    mounting a light emitting device on a bottom of a package;
    forming a first wavelength conversion unit by injecting and curing a liquid resin in which a nanocrystalline phosphor is mixed to cover said light emitting device; and
    forming a second wavelength conversion unit by injecting and curing, on said first wavelength conversion unit, a liquid resin in which a rare-earth-activated phosphor or a transition-metal-element-activated phosphor is mixed,
    wherein, in the forming of the second wavelength conversion unit, an optically transparent material without containing a phosphor is mixed in the resin for the second wavelength conversion unit and has a reflective index identical to or close to a reflective index of the resin for the second wavelength conversion unit.

14. The method for manufacturing a light emitting apparatus according to claim 13, wherein
    said step of forming the second wavelength conversion unit is performed by injecting and curing a liquid resin in which said rare-earth-activated phosphor or said transition-metal-element-activated phosphor and an optically transparent material without containing a phosphor are mixed.

15. The method for manufacturing a light emitting apparatus according to claim 13, further comprising the step of removing a part of said second wavelength conversion unit.

* * * * *